(12) United States Patent
Di Domenico et al.

(10) Patent No.: US 10,928,779 B2
(45) Date of Patent: Feb. 23, 2021

(54) ISOCHRONOUS PIVOT FOR TIMEPIECE RESONATORS

(71) Applicant: The Swatch Group Research and Development Ltd, Marin (CH)

(72) Inventors: Gianni Di Domenico, Neuchatel (CH); Dominique Lechot, Les Reussilles (CH); Jerome Favre, Neuchatel (CH); Baptiste Hinaux, Lausanne (CH); Jean-Jacques Born, Morges (CH); Jean-Luc Helfer, Le Landeron (CH); Pascal Winkler, St-Blaise (CH)

(73) Assignee: The Swatch Group Research and Development Ltd, Marin (CH)

( * ) Notice: Subject to any disclaimer, the term of this patent is extended or adjusted under 35 U.S.C. 154(b) by 313 days.

(21) Appl. No.: 16/104,157

(22) Filed: Aug. 17, 2018

(65) Prior Publication Data

US 2019/0064742 A1 Feb. 28, 2019

(30) Foreign Application Priority Data

Aug. 29, 2017 (EP) .................................... 17188264

(51) Int. Cl.
*G04B 31/00* (2006.01)
*G04B 17/04* (2006.01)
*G04B 17/28* (2006.01)

(52) U.S. Cl.
CPC ........... *G04B 31/00* (2013.01); *G04B 17/045* (2013.01); *G04B 17/28* (2013.01)

(58) Field of Classification Search
CPC ...... G04B 31/00; G04B 17/045; G04B 17/28; G04B 17/06; G04B 17/04; G04B 31/02; G04B 15/00; G04B 15/06; G04B 15/08; G04B 15/14; G04B 15/02; G04B 15/12; G04B 13/025; G04B 17/063; G04B 17/26;

(Continued)

(56) References Cited

U.S. PATENT DOCUMENTS 3,352,000 A 11/1967 Altenburger
9,134,705 B2 * 9/2015 Vardi .................. G04B 17/045
9,323,222 B2 * 4/2016 Stranczl ................. G04B 17/04

(Continued)

FOREIGN PATENT DOCUMENTS

EP 3 021 174 A1 5/2016
FR 1 502 775 11/1967

OTHER PUBLICATIONS

European Search report dated Feb. 28, 2018 in European Application 17188264.0, filed on Aug. 29, 2017.

*Primary Examiner* — Edwin A. Leon
(74) *Attorney, Agent, or Firm* — Oblon, McClelland, Maier & Neustadt, L.L.P.

(57) ABSTRACT

An isochronous pivot for a resonator including two flexible strips joining attachment points of a first and a second element, defining two strip directions, and a pivot axis, at the intersection of their projections or at their intersection, each strip having a free length between its attachment points, and an axial distance between the pivot axis and the attachment point thereof farthest from the axis, the attachment point ratio X=D/L being greater than one for each strip, the strip directions defining with the axis a first apex angle whose value in degrees includes between f1(X)=108+67/(10X−6), and f2(X)=113+67/(10X−6).

13 Claims, 4 Drawing Sheets

(58) Field of Classification Search
CPC ...... G04B 17/00; G04B 17/20; G04B 17/285; G04B 17/02
USPC ................ 368/324, 161, 169, 127, 129–131
See application file for complete search history.

(56) References Cited

U.S. PATENT DOCUMENTS

| | | |
|---|---|---|
| 9,477,205 B2 * | 10/2016 | Born ..................... G04C 3/101 |
| 2013/0176829 A1 * | 7/2013 | Cusin .................. G04B 17/285 368/127 |
| 2017/0227930 A1 | 8/2017 | Di Domenico et al. |
| 2017/0322517 A1 | 11/2017 | Semon et al. |

* cited by examiner

ISOCHRONOUS PIVOT FOR TIMEPIECE RESONATORS

This application claims priority from European Patent Application No. 17188264.0 filed on Aug. 29, 2017, the entire disclosure of which is hereby incorporated herein by reference.

FIELD OF THE INVENTION

The invention concerns an isochronous pivot for timepiece resonators, with a flexure bearing, comprising at least one pair including two flexible strips each joining a first point of attachment of a first element to a second point of attachment of a second element, said first attachment points defining, with said respective second attachment points, two main strip directions, said first element and said second element each being stiffer than each of said flexible strips, and each able to form a movable inertial element inside a said resonator, and said two main strip directions defining a theoretical pivot axis at their intersection when said two flexible strips are coplanar, or at the intersection of their projections onto a reference plane parallel to said two flexible strips, when said two flexible strips extend on two levels parallel to said reference plane but are not coplanar, each said flexible strip having a free length between its two attachment points, and having an axial distance between said theoretical pivot axis and whichever of its two said attachment points is farthest therefrom, and wherein, for each said flexible strip, the main attachment point ratio $X=D/L$ between said axial distance and said free length is greater than one, and wherein said two main strip directions define with said theoretical pivot axis a first apex angle $\alpha$ whose value in degrees satisfies the relation $f1(X)<\alpha<f2(X)$, with $f1(X)=108+67/(10X-6)$, and $f2(X)=113+67/(10X-6)$.

The invention also concerns a resonator comprising a first element and a second element, joined by at least one pair including two flexible strips comprised in such a pivot.

The invention also concerns a timepiece movement including at least one such resonator.

The invention also concerns a watch including at least one such movement.

BACKGROUND OF THE INVENTION

The use of flexure bearings, particularly having flexible strips, in mechanical timepiece oscillators, is made possible by processes, such as MEMS, LIGA or similar, for developing micromachinable materials, such as silicon and silicon oxides, which allow for very reproducible fabrication of components which have constant elastic characteristics over time and high insensitivity to external agents such as temperature and moisture. Flexure pivots, such as those disclosed in European Patent Applications No. 14199039 or No. 16155039 by the same Applicant, can, in particular, replace a conventional balance pivot, and the balance spring usually associated therewith. Removing pivot friction also substantially increases the quality factor of an oscillator.

However, flexure pivot bearings are known to have a non-linear return force, and undesired movement of the instantaneous axis of rotation.

The work by Wittrick in 1951 allowed a reduction in undesired displacement by positioning the crossing point of the strips at seven eighths of their length. European Patent Application No. 14199039 by the same Applicant proposes, in combination with this arrangement, the choice of a specific apex angle between the strips, to optimise the linearity of the elastic return force in order to make the resonator isochronous.

Such a pivot comprising two strips which cross in projection cannot, however, be etched in two dimensions in a single etch, which complicates manufacture.

European Patent Application No. 16155039 by the same Applicant, SWATCH GROUP RESEARCH & DEVELOPMENT Ltd, proposes a 2D geometry achievable in a single-level etch, and which has the desired advantages of linearity and low undesired displacement. It describes a timepiece resonator mechanism comprising a first support with a first anchor and a second anchor to which is attached a flexure pivot bearing mechanism, which defines a virtual pivot axis about which rotatably pivots a pivoting weight, and which includes at least one front RCC flexure pivot and one back RCC flexure pivot, mounted in series and head-to-tail relative to each other about said virtual pivot axis, said front RCC flexure pivot comprising, between said first support and an intermediate rotary support, two straight flexible front strips of the same front length LA between their attachment points, defining two linear front directions which intersect at said virtual pivot axis and which define a front angle with said virtual pivot axis, and wherein the respective anchors of said two straight flexible front strips farthest from said virtual pivot axis are both at a same front distance D from said virtual pivot axis, and said flexible back RCC pivot including, between said intermediate rotary support, which includes a third anchor and a fourth anchor, and said pivoting weight, two straight flexible back strips having the same back length LP between their attachment points, defining two linear back directions which intersect at said virtual pivot axis and which define a back angle with said virtual pivot axis, and wherein the respective anchors of said two straight flexible back strips farthest from said virtual pivot axis are both at a same back distance DP from said virtual pivot axis. This flexure pivot bearing mechanism is planar, the centre of inertia of the assembly formed by said pivoting weight and any added inertial weight carried by said pivoting weight is on said virtual pivot axis or in immediate proximity thereto, and said front angle expressed in degrees is comprised between:

$$109.5+5/[(DA/LA)-(2/3)] \text{ and } 114.5+5/[(DA/LA)-(2/3)]$$

and said back angle expressed in degrees is comprised between:

$$109.5+5/[(DP/LP)-(2/3)] \text{ and } 114.5+5/[(DP/LP)-(2/3)].$$

SUMMARY OF THE INVENTION

The invention proposes to define a resonator with a flexure pivot bearing, which is isochronous, simple to manufacture and which withstands shocks without thereby degrading a high quality factor.

It more particularly concerns optimising the use of an RCC (Remote Compliance Centre) pivot, with strips forming a V-shape, and an offset centre of rotation, which is easy to manufacture and robust, to satisfy this specification.

To this end, the invention concerns an isochronous pivot for a timepiece resonator with a flexure bearing.

The invention also concerns a resonator comprising a first element and a second element, joined by at least one pair including two flexible strips comprised in such a pivot.

The invention also concerns a timepiece movement including at least one such resonator.

The invention also concerns a watch including at least one such movement.

BRIEF DESCRIPTION OF THE DRAWINGS

Other features and advantages of the invention will appear upon reading the following detailed description, with reference to the annexed drawings, in which.

DETAILED DESCRIPTION OF PREFERRED EMBODIMENTS

Figure 1A:
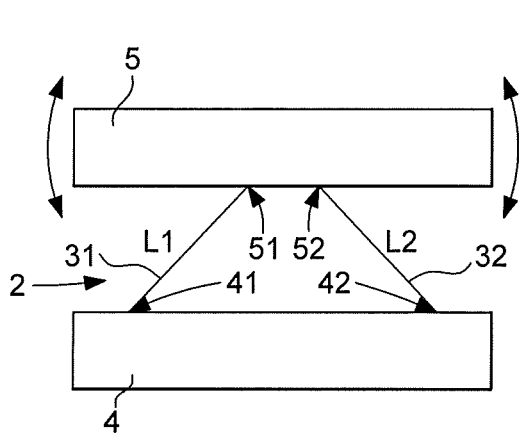
FIG. 1A represents a schematic plan view of the attachment points of an RCC pivot with two strips forming a V-shape, between a fixed base and a solid inertial element.
Figure 1B:
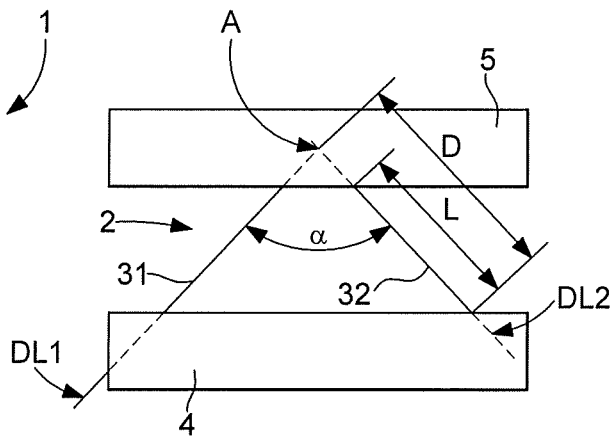
FIG. 1B represents, in a similar manner, the free lengths L and axial distances D of these strips, their apex angle α, and their crossing point.

The invention concerns an isochronous pivot 1 for a timepiece resonator 100, with a flexure bearing, comprising at least one pair, generically denoted 2, or more particularly a first pair 21 or a second pair 22, according to the variants illustrated by the Figures. This pair 2 includes two flexible strips 3: 31, 32, each joining a first attachment point 41, 42 of a first element 4 to a second attachment point 51, 52 of a second element 5. These first attachment points 41, 42 define, with the respective second attachment points 51, 52, two main strip directions DL1 and DL2. The first element 4 and second element 5 are each stiffer than each of flexible strips 3, and each is able to form a movable inertial element inside a resonator 100.

The two strip directions DL1, DL2 define a theoretical pivot axis A, at their crossing point when the two flexible strips 31, 32 are coplanar, or at the crossing point of their projections onto a reference plane parallel to the two flexible strips 31, 32, when the two flexible strips 31, 32 extend on two levels parallel to the reference plane but are not coplanar.

Each flexible strip 31, 32 has a 'free' length L1, L2 between its two attachment points 41, 51, 42, 52, and having an axial distance D1, D2 between theoretical pivot axis A and whichever of its two attachment points 41, 51, 42, 52 is farthest therefrom.

For each flexible strip 31, 32, the main attachment point ratio D1/L1, D2/L2 between the axial distance and the free length is greater than one.

The invention also concerns a resonator 100 including a first element 4 and a second element 5, joined by at least one such pair 2 which includes two flexible strips 31, 32 comprised in such a pivot 1.

Figure 2:
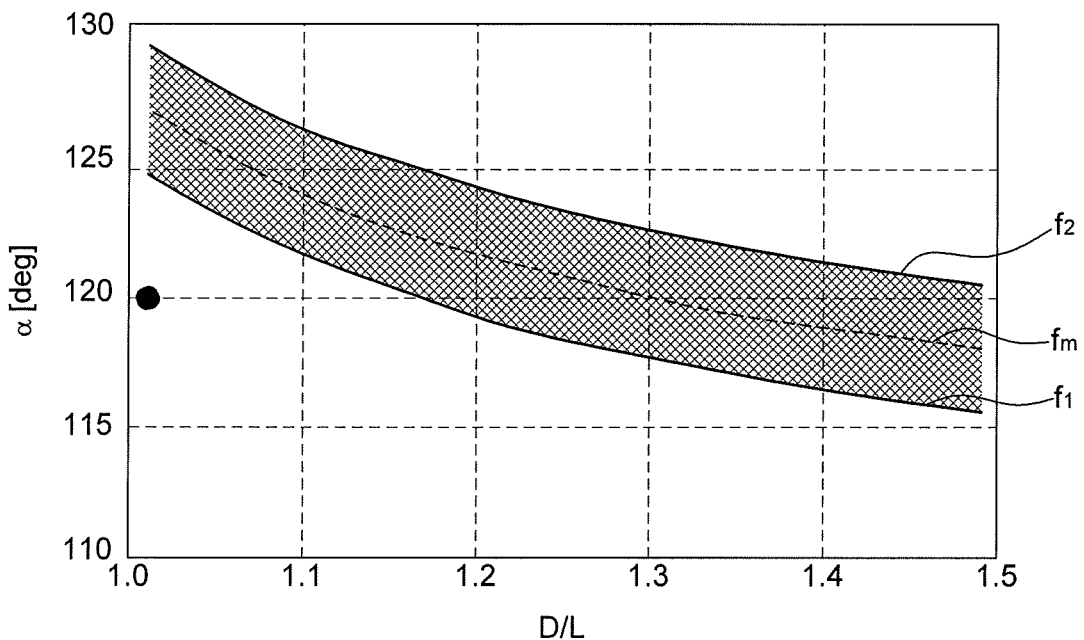
FIG. 2 is a graph which represents the evolution of the optimum apex angle on the ordinate, as a function of the ratio X=D/L on the abscissa, with an area of improved isochronism between two curves, lower curve f1 and upper curve f2, on either side of a mean curve fm.

As seen in FIG. 2, the two main strip directions DL1, DL2 define, with theoretical pivot axis A, the first apex angle α, whose value depends on the main attachment ratio D1/L1, D2/L2, between a first lower function f1 such that α=f1(D/L), and a first higher function f2, such that α=f2(D/L).

More particularly, f1(X)=108+67/(10X−6), with X=D/L.

More particularly, f2(X)=113+67/(10X−6), with X=D/L.

In particular, D1/L1=D2/L2=D/L=X, and is greater than 1. The value in degrees of first apex angle α then satisfies the relation f1(D/L)<α<f2(D/L), with f1(D/L)=108+67/(10X−6), and f2(D/L)=113+67/(10X−6), with X=D/L.

More particularly, the two main strip directions DL1 and DL2 define, with theoretical pivot axis A, a first apex angle α, which is comprised between 115° and 130° inclusive. This is equivalent to confining the value X=D/L between the values X=1 and X=1.55.

More particularly, theoretical pivot axis A is geometrically located in first element 4 or in second element 5.

Figure 3:
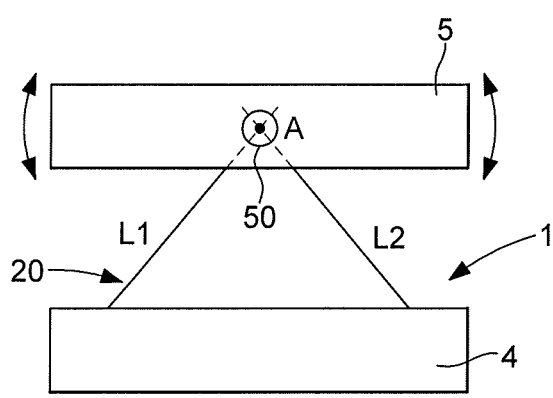
FIG. 3 represents, in a similar manner to FIG. 1, a similar RCC pivot including an eye around the crossing point of the strips.

FIG. 3 illustrates the advantageous case where theoretical pivot axis A is geometrically located in second element 5.

More particularly, this theoretical pivot axis A is geometrically located in an opening called an 'eye' 40, 50, comprised in first element 4 or second element 5.

Figure 4:
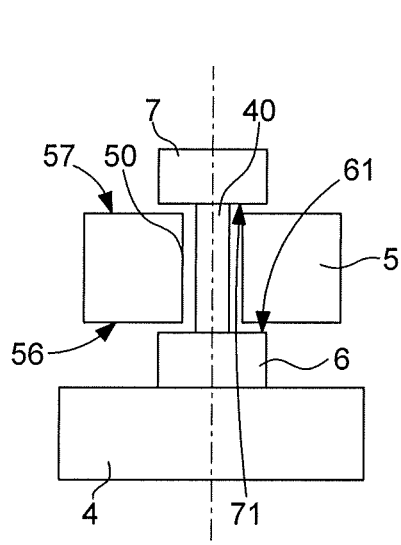
FIG. 4 represents, in cross-section, the area of an eye like that of FIG. 3, which surrounds a core provided with two stop weights forming an axial shock absorber on either side of this eye.
Figure 5:
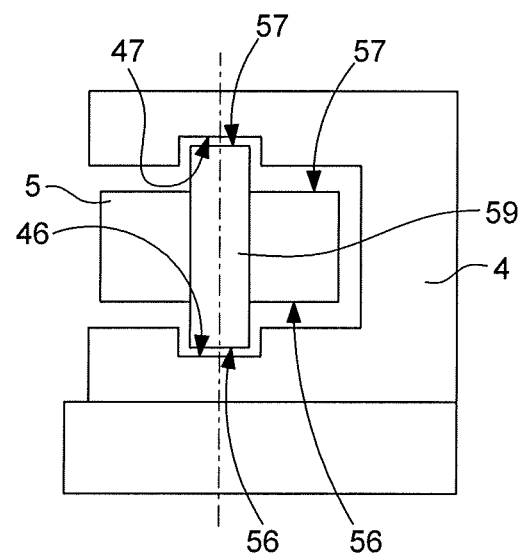
FIG. 5 represents, in a similar manner to FIG. 4, the reverse configuration with the eye provided with a movable arbor between two upper and lower counterbores of a fixed element.

FIG. 4 represents, in cross-section, the area of an eye 50 in second inertial element 5, which surrounds a core 40, integral here, in a non-limiting manner, with first element 4 which forms a fixed weight, and said core 40 is provided with two stop weights 6 and 7 forming an axial shock absorber on either side of eye 50 and of inertial element 5, whose lower surface 56 and upper surface 57 are arranged to cooperate as end stops with stop weights 6 and 7. FIG. 5 illustrates the reverse configuration with eye 50 provided with a movable arbor 59 between two upper 46 and lower 47 counterbores of a fixed element 4, the ends 56 and 57 of this arbor 59 being arranged to cooperate as end stops with counterbores 46 and 47.

More particularly, pivot 1 includes at least one pair 2 including two flexible strips 31, 32, which are either identical in symmetry with respect to a plane of symmetry passing through theoretical pivot axis A when the two flexible strips 31, 32 are coplanar, or identical in symmetry in projection onto a reference plane parallel to the two flexible strips 31, 32 when the two flexible strips 31, 32 extend on two levels parallel to the reference plane but are not coplanar, with respect to a plane of symmetry passing through theoretical pivot axis A.

More particularly, each pair 2 comprised in pivot 1, includes two flexible strips 31, 32, which are either identical in symmetry with respect to a plane passing through theoretical pivot axis A when the two flexible strips 31, 32 are coplanar, or identical in symmetry in projection onto a reference plane parallel to the two flexible strips 31, 32 when the two flexible strips 31, 32 extend on two levels parallel to the reference plane but are not coplanar.

More particularly, pivot 1 includes at least one pair 2 including two flexible strips 31, 32, which are coplanar.

More particularly, pivot 1 includes at least one pair 2 including two flexible strips 31, 32, which extend on two levels parallel to the reference plane but are not coplanar.

More particularly, pivot 1 is symmetrical, at least in projection onto the reference plane, with respect to a plane of symmetry passing through theoretical pivot axis A, and the centre of mass of resonator 100 in its rest position is geometrically located on the plane of symmetry.

Advantageously, the centre of mass of the resonator, in its rest position, is positioned on the axis of symmetry of the pivot, and at a short distance from the axis of rotation A defined by the crossing point of the extensions of the strips, which has the effect of offsetting the undesired displacement of the pivot. For a single pivot, the optimum distance depends on the relation X=D/L. Thus, the centre of mass of resonator 100 in its rest position is separated from theoretical pivot axis A by a distance ε which depends on the free lengths L1, L2, and on attachment point ratios D1/L1, D2/L2. More particularly, D1/L1=D2/L2=D/L=X. More particularly still, D1=D2=D and L1=L2=L, and this distance ε is substantially equal to the value $(2D^2/L-1.6.D-0.1\ L)$. More particularly, this distance ε is comprised between 0.8 times and 1.2 times the value $(2D^2/L-1.6.D-0.1\ L)$.

The RCC pivots described above can be combined in various ways. In particular, FIGS. 6 to 8 illustrate non-limiting variants, resulting from different combinations of pairs of strips.

More particularly, pivot 1 thus includes, in addition to a first pair 21 including the two flexible strips 31, 32, each joining a first attachment point 41, 42 of a first element 4 to a second attachment point 51, 52 of a second element 5, at least a second pair 22 including two other flexible strips 33, 34, each joining, on the one hand, a primary attachment point 43, 44 of first element 4 or a secondary attachment point 53, 54 of second element 5, to, on the other hand, a tertiary attachment point 63, 64, comprised in a third element 6 arranged to be fixedly secured to a fixed structure of resonator 100.

More particularly, first element 4 or second element 5 is an inertial element, and theoretical pivot axis A is geometrically located in an eye 40, 50 of said inertial element. FIGS. 6 to 8 include such an eye 50 in inertial element 5.

Figure 6:
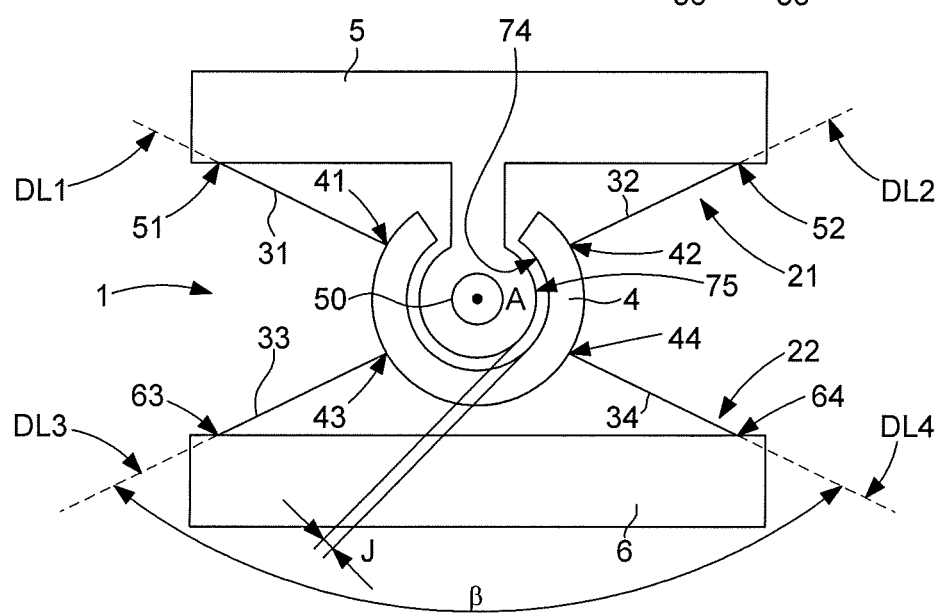
FIG. 6 represents, in a similar manner to FIG. 1, the series arrangement of two RCC pivots, each with an optimum angle, with the inertial element including a stud provided with an eye as in FIG. 3, and including a partial peripheral surface partially of revolution, delimited by a chamber of an intermediate element suspended to the fixed base by two strips, in the opposite direction to those connecting the inertial element to the intermediate element.
Figure 7:
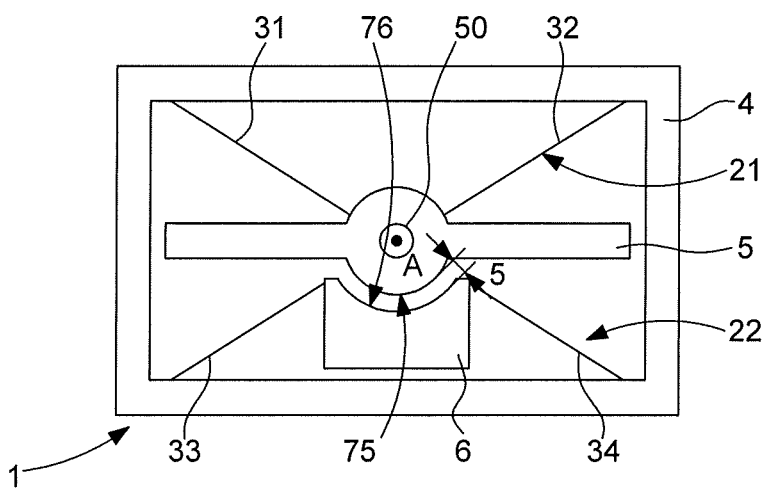
FIG. 7 represents, in a similar manner to FIG. 6, the series arrangement of two RCC pivots, each with an optimum angle, with the inertial element including an eye as in FIG. 3, and including a peripheral surface partially of revolution delimited by a chamber of the fixed base, to which is suspended by two strips in opposite directions, an intermediate frame element to which is suspended the inertial element.
Figure 8:
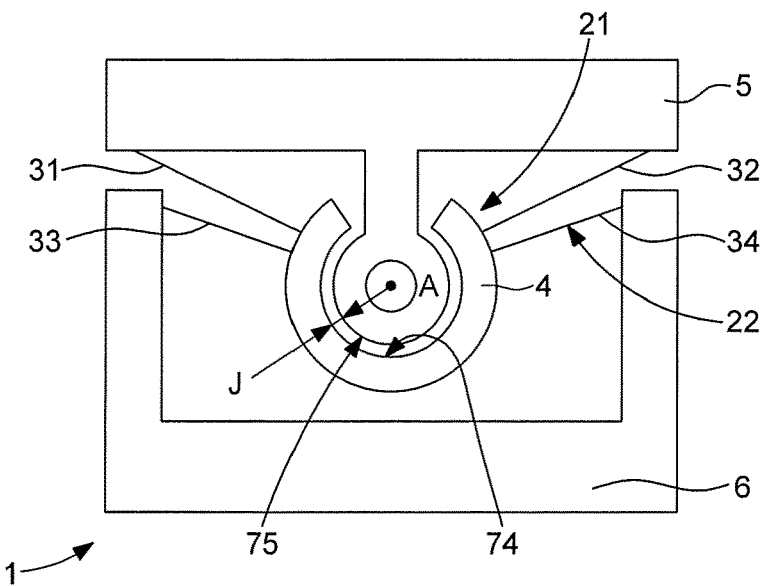
FIG. 8 represents, in a similar manner to FIG. 6, the series arrangement of two RCC pivots, each with an optimum angle, with the strips disposed in the same direction, but with two different apex angles, chosen above and below the middle of the area of improved isochronism.

More particularly, as seen in FIGS. 6 and 8, first element 4 or second element 5 includes a concave surface 74 arranged to surround at a distance, over at least 180°, a convex surface 75 comprised in second element 5 or respectively first element 4, with, in a rest position of pivot 1, a clearance which, at every point, is greater than or equal to a safety clearance J between convex surface 75 and concave surface 74.

FIG. 6 illustrates the series arrangement of two RCC pivots, each with an optimum angle, with inertial element 5 including a stud provided with an eye 50, and including a peripheral surface partially of revolution 75, delimited by a chamber 74 of an intermediate element 4 suspended to fixed base 6 by two strips 33, 34, in the opposite direction to those 31, 32 connecting inertial element 5 to intermediate element 4.

More particularly, as seen in FIG. 7, first element 4 or second element 5 is an inertial element, and third element 6, particularly the fixed base, includes an internal surface 76 arranged to surround at a distance, over at least 180°, a convex surface 75 comprised in the inertial element, with, in a rest position of pivot 1, a clearance which, at every point, is greater than or equal to a safety clearance J between convex surface 75 and internal surface 76.

FIG. 7 concerns the series arrangement of two RCC pivots, each with an optimum angle, with inertial element 5 including an eye 50, and including a peripheral surface partially of revolution 75 delimited by a chamber 76 of fixed base 6, to which is suspended by two strips 33, 34 in opposite directions, an intermediate element 4 forming a frame and to which is suspended inertial element 5.

More particularly, as seen in FIG. 8, which concerns the series arrangement of two RCC pivots, each with a different optimum angle α, β with the strips disposed in the same direction, but with two different apex angles, chosen above and below the middle of the area of improved isochronism: on the one hand, primary attachment points 43, 44 of first element 4 or secondary attachment points 53, 54 of second element 5, and on the other hand, said tertiary attachment points (63, 64) define two secondary strip directions DL3, DL4, which together form a second apex angle β at a secondary axis B defined by the intersection, in plane or in projection, of secondary strip directions DL3, DL4. This second apex angle β, like first apex angle α, is comprised between 115° and 130° inclusive, or its value depends on a secondary attachment point ratio D3/L3, D4/L4, between a first lower function f1 such that β=f1(D/L), and a first upper function f2, such that β=f2(D/L).

Figure 9:
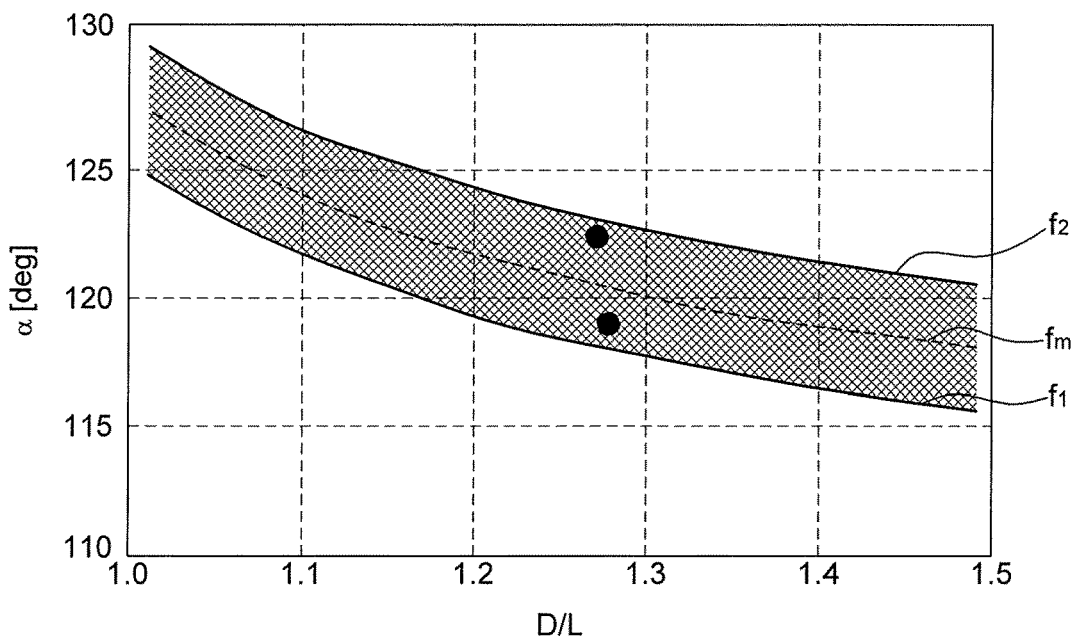
FIG. 9, which is similar to FIG. 2, shows the positioning of the two angles of FIG. 8.
Figure 10:
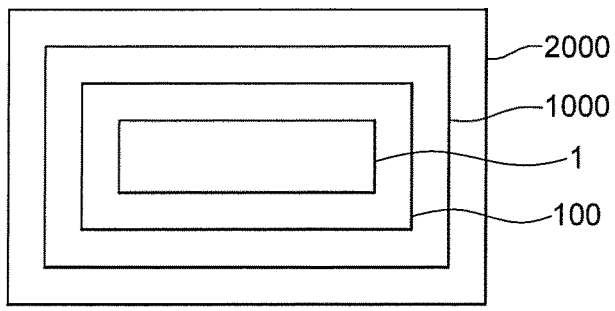
FIG. 10 is a block diagram which represents a watch including a movement incorporating a resonator provided with such a pivot.
Figure 11:
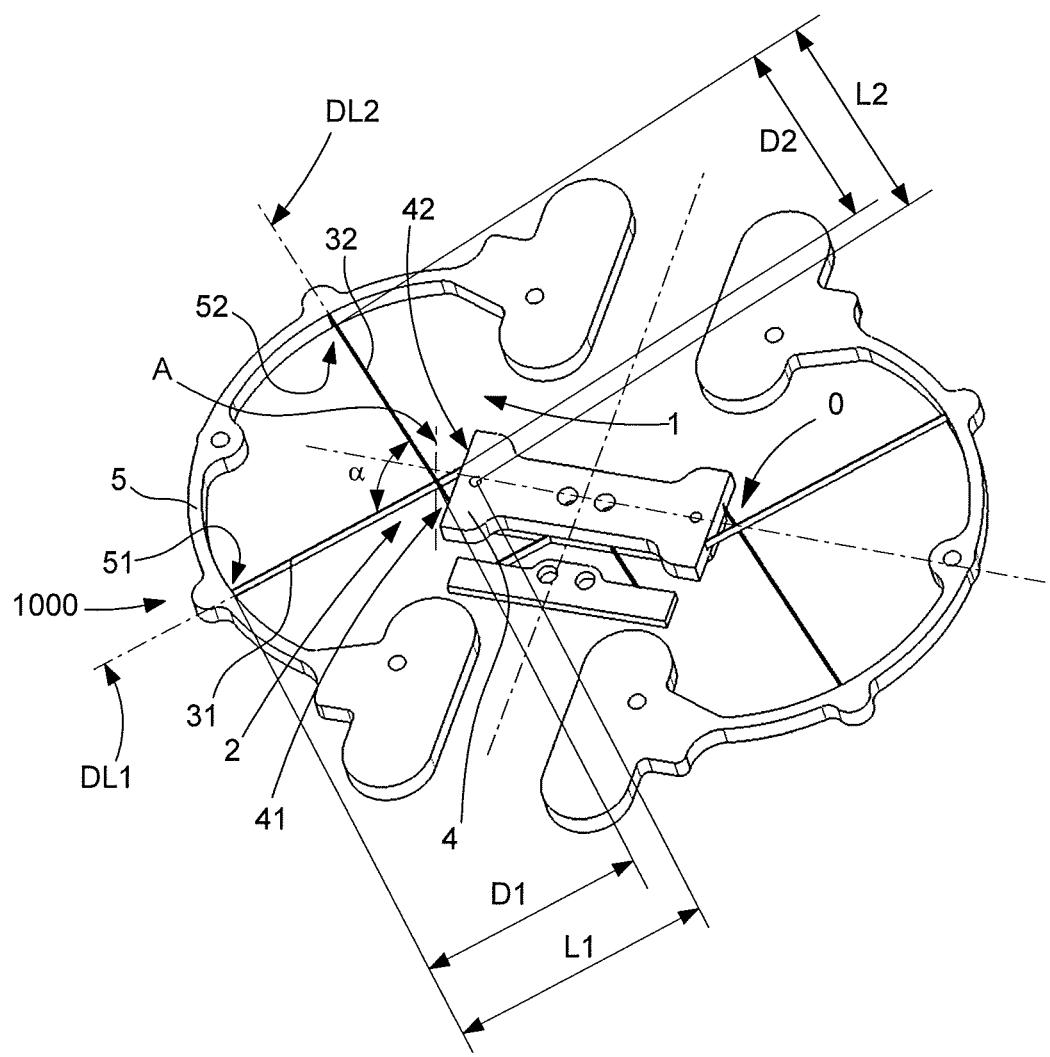
FIG. 11, taken from European Patent Application No. EP14199039 by the same Applicant, illustrates a resonator pivot configuration with non-coplanar crossed strips.

More particularly, according to the invention and as seen in FIG. 9, a median function fm(X)=110.5+67/(10X−6) defines an intermediate ratio between the first lower function f1(X)=108+67/(10X−6), and the first upper function f2(X)=113+67/(10X−6), with X=D/L, and the first apex angle α and the second apex angle β are positioned between first lower function f1 and first upper function f2, on either side of median function fm.

More particularly, theoretical pivot axis A is coincident with secondary axis B.

The invention also concerns a timepiece movement 1000 including at least one such resonator 100.

The invention also concerns a watch 2000 including such a timepiece movement 1000.

What is claimed is:

1. An isochronous pivot for a timepiece resonator, with a flexure bearing, comprising:
a first pair including two flexible strips each joining a first point of attachment of a first element to a second point of attachment of a second element, said first attachment points defining, with said respective second attachment points, two main strip directions, said first element and said second element each being stiffer than each of said flexible strips, and each able to form a movable inertial element inside said resonator, and said two main strip directions defining a theoretical pivot axis at their intersection when said two flexible strips are coplanar, or symmetrical in projection onto a reference plane parallel to said two flexible strips when said two flexible strips extend on two levels parallel to said reference plane but are not coplanar, each said flexible strip having a free length between its two attachment points, and having an axial distance between said theoretical pivot axis and whichever of its two attachment points is farthest therefrom, wherein, for each said flexible strip, the main attachment point ratio between said axial distance and said free length is greater than one, wherein said two main strip directions define with said theoretical pivot axis a first apex angle whose value in degrees satisfies the relation $f1(D/L)<\alpha<f2(D/L)$, with $f1(X)=108+67/(10X-6)$, and $f2(X)=113+67/(10X-6)$, with $X=D/L$, wherein said two main strip directions define with said theoretical pivot axis a first apex angle comprised between 115° and 130° inclusive, wherein said pivot includes a second pair including two other flexible strips each joining a primary attachment point of said first element or a secondary attachment point of said second element, to a third attachment point comprised in a third element arranged to be fixedly secured to a fixed structure of said resonator, wherein said primary attachment points of said first element or secondary attachment points of said second element and said tertiary attachment points define two secondary strip directions together forming a second apex angle at a secondary axis defined by the intersection, in plane or in projection, of said secondary strip directions, said second apex angle being comprised between 115° and 130° inclusive, and whose value in degrees satisfies the relation $f1(D/L)<\beta<f2(D/L)$, with $f1(X)=108+67/(10X-6)$, and $f2(X)=113+67/(10X-6)$, with $X=D/L$, wherein a median function $fm(X)=110.5+67/(10X-6)$ defines an intermediate ratio between said first lower function $f1(X)=108+67/(10X-6)$, and said first upper function $f2(X)=113+67/(10X-6)$, with $X=D/L$, wherein said first apex angle and said second apex angle are positioned between said first lower function f1 and said first upper function f2, on either side of said median function fm, wherein said first element or said second element comprises a concave surface arranged to surround at a distance, over at least 180°, a convex surface comprised in said second element or said first element respectively, with, in a rest position of said pivot, a clearance which, at every point, is greater than or equal to a safety clearance between said convex surface and said concave surface, and wherein said theoretical pivot axis is geometrically located in an eye, the eye being an opening in said first element or said second element.

2. The pivot according to claim 1, wherein said first element or said second element is an inertial element, and wherein said theoretical pivot axis is geometrically located in said eye comprised in said inertial element.

3. An isochronous pivot for a timepiece resonator, with a flexure bearing, comprising:

a first pair including two flexible strips each joining a first point of attachment of a first element to a second point of attachment of a second element, said first attachment points defining, with said respective second attachment points, two main strip directions, said first element and said second element each being stiffer than each of said flexible strips, and each able to form a movable inertial element inside said resonator, and said two main strip directions defining a theoretical pivot axis at their intersection when said two flexible strips are coplanar, or symmetrical in projection onto a reference plane parallel to said two flexible strips when said two flexible strips extend on two levels parallel to said reference plane but are not coplanar, each said flexible strip having a free length between its two attachment points, and having an axial distance between said theoretical pivot axis and whichever of its two attachment points is farthest therefrom, wherein, for each said flexible strip, the main attachment point ratio between said axial distance and said free length is greater than one, wherein said two main strip directions define with said theoretical pivot axis a first apex angle whose value in degrees satisfies the relation $f1(D/L)<\alpha<f2(D/L)$, with $f1(X)=108+67/(10X-6)$, and $f2(X)=113+67/(10X-6)$, with $X=D/L$, wherein said two main strip directions define with said theoretical pivot axis a first apex angle comprised between 115° and 130° inclusive, wherein said pivot includes a second pair including two other flexible strips each joining a primary attachment point of said first element to a third attachment point comprised in a third element arranged to be fixedly secured to a fixed structure of said resonator, wherein said primary attachment points of said first element or secondary attachment points of said second element and said tertiary attachment points define two secondary strip directions together forming a second apex angle at a secondary axis defined by the intersection, in plane or in projection, of said secondary strip directions, said second apex angle being comprised between 115° and 130° inclusive, and whose value in degrees satisfies the relation $f1(D/L)<\beta<f2(D/L)$, with $f1(X)=108+67/(10X-6)$, and $f2(X)=113+67/(10X-6)$, with $X=D/L$, wherein a median function $fm(X)=110.5+67/(10X-6)$ defines an intermediate ratio between said first lower function $f1(X)=108+67/(10X-6)$, and said first upper function $f2(X)=113+67/(10X-6)$, with $X=D/L$, wherein said first apex angle and said second apex angle are positioned between said first lower function f1 and said first upper function f2, on either side of said median function fm, wherein said first element or said second element is an inertial element, and wherein said third element comprises an internal surface arranged to surround at a distance a convex surface comprised in said inertial element, with, in a rest position of said pivot, a clearance which, at every point, is greater than or equal to a safety clearance between said convex surface and said internal surface, wherein said theoretical pivot axis is geometrically located in an eye, the eye being an opening in said first element or said second element, and wherein said first element completely surrounds said second element and said third element.

4. The pivot according to claim 1, wherein said theoretical pivot axis and secondary axis are coincident.

5. The pivot according to claim 1, wherein said two flexible strips of the first pair are either identical in symmetry with respect to a plane of symmetry passing through said theoretical pivot axis when said two flexible strips are coplanar, or identical in symmetry in projection onto a reference plane parallel to said two flexible strips when said two flexible strips extend on two levels parallel to said reference plane but are not coplanar, with respect to a plane of symmetry passing through said theoretical pivot axis.

6. The pivot according to claim 5, wherein said two flexible strips of each of the first pair and the second pair are either identical in symmetry with respect to a plane passing through theoretical pivot axis when said two flexible strips are coplanar, or identical in symmetry in projection onto a reference plane parallel to said two flexible strips when said two flexible strips extend on two levels parallel to said reference plane but are not coplanar.

7. The pivot according to claim 1, wherein said two flexible strips of the first pair are coplanar.

8. The pivot according to claim 1, wherein said two flexible strips of the first pair extend on two levels parallel to said reference plane but are not coplanar.

9. The pivot according to claim 7, wherein said two flexible strips of the first pair extend on two levels parallel to said reference plane but are not coplanar.

10. The resonator comprising the pivot according to claim 1, wherein the centre of mass of said resonator in its rest position is separated from said theoretical pivot axis by a distance which is comprised between 0.8 times and 1.2 times the value ($2D^2/L-1.6.D-0.1\ L$).

11. The resonator according to claim 10, wherein said pivot is symmetrical, at least in projection onto said reference plane, with respect to a plane of symmetry passing through said theoretical pivot axis, and wherein the centre of mass of said resonator in its rest position is geometrically located on said plane of symmetry.

12. A timepiece movement including the resonator according to claim 10.

13. A watch comprising the timepiece movement according to claim 12.

* * * * *